United States Patent
Hansson

[19]

[11] Patent Number: 6,133,792
[45] Date of Patent: Oct. 17, 2000

[54] METHOD AND APPARATUS FOR PREVENTING POWER AMPLIFIER SATURATION

[75] Inventor: Lars Thomas Hansson, Lund, Sweden

[73] Assignee: Telefonakteibolaget LM Ericsson, Stockholm, Sweden

[21] Appl. No.: 09/154,502

[22] Filed: Sep. 17, 1998

[51] Int. Cl.[7] .................................................. H03G 3/20
[52] U.S. Cl. .......................................... 330/279; 330/285
[58] Field of Search .................................. 330/279, 285, 330/289, 296, 297

[56] References Cited

U.S. PATENT DOCUMENTS

| | | | |
|---|---|---|---|
| 4,131,860 | 12/1978 | Fyot | 330/279 |
| 4,317,083 | 2/1982 | Boyd | 220/296 |
| 4,339,730 | 7/1982 | Yokoyama | 330/297 |
| 4,378,530 | 3/1983 | Garde | 330/297 |
| 4,630,315 | 12/1986 | Watkinson | 455/109 |
| 4,631,491 | 12/1986 | Smithers | 330/149 |
| 4,636,741 | 1/1987 | Mitzlaff | 330/127 |
| 4,994,757 | 2/1991 | Bickley et al. | 330/285 |
| 5,138,274 | 8/1992 | Nakanishi et al. | 330/285 X |
| 5,172,877 | 12/1992 | Hattori et al. | 248/68.1 |
| 5,251,330 | 10/1993 | Chiba et al. | 455/91 |
| 5,430,410 | 7/1995 | Raynard et al. | 330/279 |
| 5,553,318 | 9/1996 | Ohmagari et al. | 455/126 |
| 5,606,625 | 2/1997 | Dallavalle et al. | 381/107 |
| 5,796,309 | 8/1998 | Nguyen | 330/289 |

FOREIGN PATENT DOCUMENTS

| | | |
|---|---|---|
| 54-104760 | 8/1979 | Japan . |
| 55-127709 | 10/1980 | Japan . |
| 56-12111 | 2/1981 | Japan . |
| 62-213404 | 9/1987 | Japan . |
| 7-283657 | 10/1995 | Japan . |
| 1417174 | 8/1988 | U.S.S.R. . |
| 2 123 231 | 1/1984 | United Kingdom . |
| 95/34128 | 12/1995 | WIPO . |

*Primary Examiner*—Steven J. Mottola
*Attorney, Agent, or Firm*—Burns, Doane, Swecker & Mathis, L.L.P.

[57] ABSTRACT

The present invention provides a power amplifier with a reduced voltage supply which, in turn, reduces amplifier power dissipation and can be efficiently used by a communication device during signal transmission. Additionally, the present invention provides a circuit for controlling the voltage supply input into a power amplifier which addresses the problems associated reducing power dissipation while increasing power amplifier efficiency and insuring that the power amplifier is not saturated.

15 Claims, 5 Drawing Sheets

METHOD AND APPARATUS FOR PREVENTING POWER AMPLIFIER SATURATION

BACKGROUND

The present invention generally relates to radiocommunication systems and, more specifically, to an apparatus and associated method for efficiently controlling power amplifiers within radio transmitters in cellular systems.

The cellular telephone industry has made phenomenal strides in commercial operations in the United States as well as the rest of the world. Growth in major metropolitan areas has far exceeded expectations and is outstripping system capacity. If this trend continues, the effects of rapid growth will soon reach even the smallest markets. Innovative solutions are required to meet these increasing capacity needs as well as to maintain high quality service and avoid rising prices.

Throughout the world, one important step in cellular systems is to change from analog to digital transmissions. Equally important is the choice of an effective digital transmission scheme for implementing the next generation of cellular technology. Furthermore, it is widely believed that the first generation of personal communication networks (PCN) (employing low cost, pocket-sized, cordless telephones that can be carried comfortably and used to make and receive calls in the home, office, street, car, etc.), would be provided by the cellular carriers using the next generation digital cellular system infrastructure and the cellular frequencies. The key feature demanded in these new systems is increased traffic capacity.

Currently, channel access is most commonly achieved using frequency division multiple access (FDMA) and time division multiple access (TDMA) methods. In FDMA, a communication channel is a single radio frequency band into which a signal's transmission power is concentrated. Interference with adjacent channels is limited by the use of bandpass filters which only pass signal energy within the specified frequency band. Thus, with each channel being assigned a different frequency, system capacity is limited by the available frequencies.

In most TDMA systems, a channel consists of a time slot in a periodic train of time intervals over the same frequency. Each period of time slots is called a frame. A given signal's energy is confined to one of these time slots. Adjacent channel interference is limited by the use of a time gate or other synchronization element that only passes signal energy received at the proper time. Thus, the portion of the interference from different relative signal strength levels is reduced.

Capacity in a TDMA system is increased by compressing the transmission signal into a shorter time slot. As a result, the information must be transmitted at a correspondingly faster bit rate which increases the amount of occupied spectrum proportionally.

With FDMA or TDMA systems, or a hybrid FDMA/TDMA system, it is desirable to avoid the case where two potentially interfering signals occupy the same frequency at the same time. In contrast, code division multiple access (CDMA) allows signals to overlap in both time and frequency. Thus, all CDMA signals share the same frequency spectrum. In either the frequency or the time domain, the multiple access signals appear to be on top of each other.

For all such systems, but especially CDMA systems, power control is an important technique for balancing the desire to provide an end user with a sufficiently strong signal while at the same time not causing too much interference to other users. Power amplifiers (PAs) are widely utilized in radio transmitters in order to amplify an unamplified RF signal to a predefined power level at which the RF signal is to be transmitted. The power level at which the RF signal is transmitted is normally set to one of several predefined power level increments which is based upon the power level of a received transmission at a base station. The more accurate the PA in the amplification of these signals to the predefined power levels, the more efficient the transmitter operation.

One goal in power amplifier operation is to reduce the power dissipation that occurs. To reduce the power dissipation within a power amplifier, the voltage supplied to the amplifier is reduced via control techniques. However, when the supply voltage is reduced too much, the amplifier can be brought into a saturated state. The power amplifier would then act non-linearly, causing distortion of the output signal.

While there have been attempts to increase power amplifier efficiency and power output, they have not been fully successful. For example, U.S. Pat. No. 5,430,410 describes the use of an envelope detector to detect the output of a power amplifier. The output signal of the power amplifier is compared to the input side of a power amplifier. The difference between the output and input is used to control the bias level of the power amplifier in order to maintain linear operation of a saturated power amplifier and thereby reduce distortion. However, this document does not address increasing efficiency in a power amplifier before saturation.

Additionally, the abstract of SU 1417174 is believed to describe the power amplification of signals in radio communication devices which attempts to improve amplifier operation and reduce distortion by inserting a differential amplifier between a power amplifier's inverting input and the output of the power amplifier. The inputs into the differential amplifier are a peak detected value of the output of amplifier and the difference between the peak value of the amplifier and a changing voltage value. The effect of this circuit is to reduce distortion by adjusting the supply voltage to compensate for the change in the bias level of the preceding amplifier stage.

None of the present power amplifiers and associated control circuits known by Applicant operate to reduce the power supply voltage thereby initiating a reduction in power dissipation and overall temperature of the mobile unit, while at the same time avoiding saturating the amplifier. Additionally, the current consumption from the battery which powers a mobile employing a power amplifier is reduced, thereby improving its performance. Thus, there is a need for a system that can utilize the advantages provided by a non-saturated power amplifier which is highly efficient.

SUMMARY

It is therefore an object of the present invention to provide a power amplifier having a reduced voltage supply which, in turn, reduces amplifier power dissipation and which can be efficiently used by a communication device during signal transmission. It is a further object of the present invention to provide a circuit for controlling the power amplifier which addresses the problems associated with reducing power dissipation and distortion while increasing power amplifier efficiency and ensuring that the power amplifier is not saturated.

Exemplary embodiments of the invention employ an amplifier and control circuit which comprises a power amplifier powered by a voltage supply, a peak detector which detects a peak amplitude of an output voltage of said power amplifier, and a differential amplifier which compares the amplitude of the output of said power amplifier to a constant reference voltage and outputs a corrected voltage supply signal.

In yet another exemplary embodiment of the present invention a method of controlling a power amplifier circuit is described which comprises detecting a peak amplitude of an output voltage from a power amplifier in said power amplifier circuit, comparing the detected amplitude of the of the output voltage to a constant reference voltage, outputting a corrected voltage signal and controlling a voltage supply of said power amplifier circuit based upon the corrected voltage signal.

Additional embodiments of the present invention include a communications device which comprises a transmitter for transmitting an outgoing signal and a receiver for receiving an incoming signal, where the transmitter further comprises a power amplifier to amplify said outgoing signals before transmission, a peak detector which detects a peak amplitude of an output of said power amplifier, and a differential amplifier which compares the amplitude of the output of said power amplifier to a reference voltage and outputs a corrected signal to be input to said power amplifier.

BRIEF DESCRIPTION OF THE DRAWINGS

These and other features, objects and advantages associated with the present invention will be more readily understood upon reading the following detailed description, when read in conjunction with the drawings in which like reference numerals refer to like elements and where.

DESCRIPTION

The present invention will now be described with reference to the accompanying drawings, in which various exemplary embodiments of the invention are shown. However, this invention may be embodied in many different forms and should not be construed as limited to the specific embodiments shown.

Figure 1:
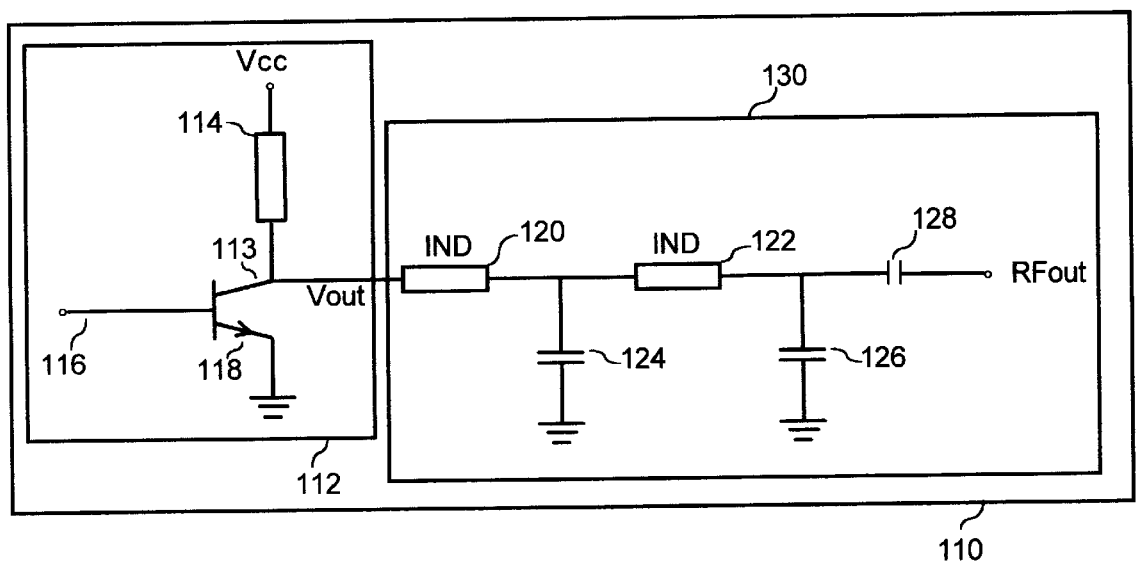
FIG. 1 is a schematic diagram of a known power amplifier circuit that can be used in a transmitter.

A schematic diagram of a typical power amplifier circuit 110 is shown in FIG. 1 that can be employed within a typical signal transmission system. An RF input signal, $RF_{IN}$, is input to a power amplifier 112 of the power amplifier circuit 110 in order to be amplified for transmission. The power amplifier 112 comprises an NPN bipolar junction transistor (BJT) shown in FIG. 1. Additionally, the BJT has a base 116, a emitter 118 and an collector 113. Collector 113 has an inductor 114 connected between the emitter and a supply voltage, $V_{CC}$. The purpose of the inductor 114 is to act as a current source. The voltage across the inductor reflects the rate of bias change in the transistor. While an NPN transistor is shown, it would be apparent to one of ordinary skill to employ a PNP transistor or any other active amplification element such as a field-effect transistor (FET) in order to amplify an RF input signal. It should also be understood that the amplification of the $RF_{IN}$ signal does not necessarily require only one transistor. Instead, it is possible that multiple transistors or FET devices could be employed to properly amplify $RF_{IN}$. For example, a multiple transistor arrangement such as a Darlington arrangement could also be employed to amplify the signal. As such, the transistor illustrated in FIG. 1 can represent only the output stage of the entire power amplifier 112.

The power amplifier circuit 110 also comprises an impedance matching network 130 located on the output of the power amplifier 112. The impedance matching network 130 further comprises an array of inductors 120 and 122 and an array of capacitors 124, 126 and 128. The purpose of the impedance matching network is to match the load of the power amplifier for optimal signal output and achieve the required signal gain from the output of the power amplifier 112.

Additionally, an output filter such as an RC circuit (not shown in the present embodiment) can also be employed to filter the output signal of unwanted noise. The amplified output signal, $RF_{OUT}$, is then coupled to an antenna and transmitted to a receiver (not shown).

When the power amplifier 112 is at maximum output power, the maximum amplitude of the output swing that can occur is the rated voltage of the supply voltage $V_{CC}$ minus the saturation voltage, $V_S$. The saturation voltage is the voltage at which the transistor enters a saturated mode. Generally, for a bipolar junction transistor, such as the one described above with respect to FIG. 1, $V_S$ (i.e., the voltage drop across the collector and emitter of the power amplifier 112) is approximately 0.2 Volts.

Figure 2A:
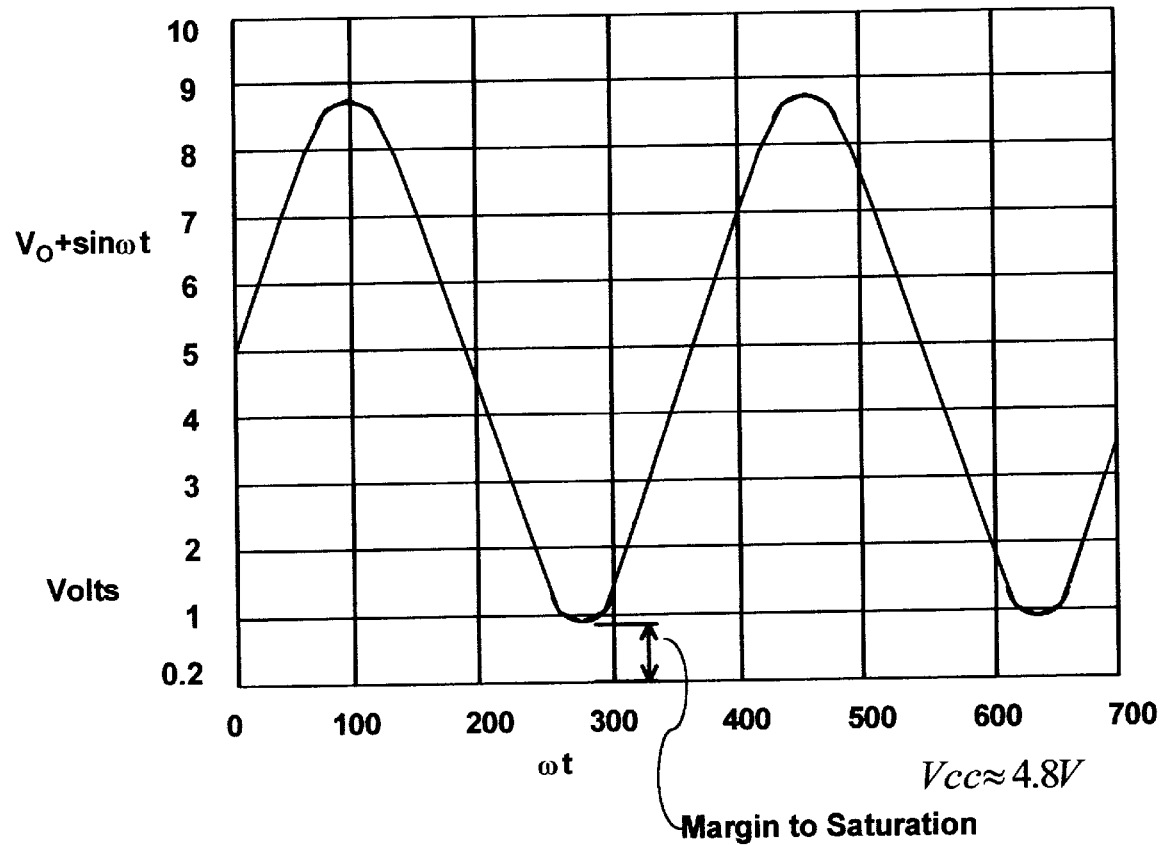
FIG. 2A is a graph of the output voltage swing of a power amplifier in a non-saturated mode.
Figure 2B:
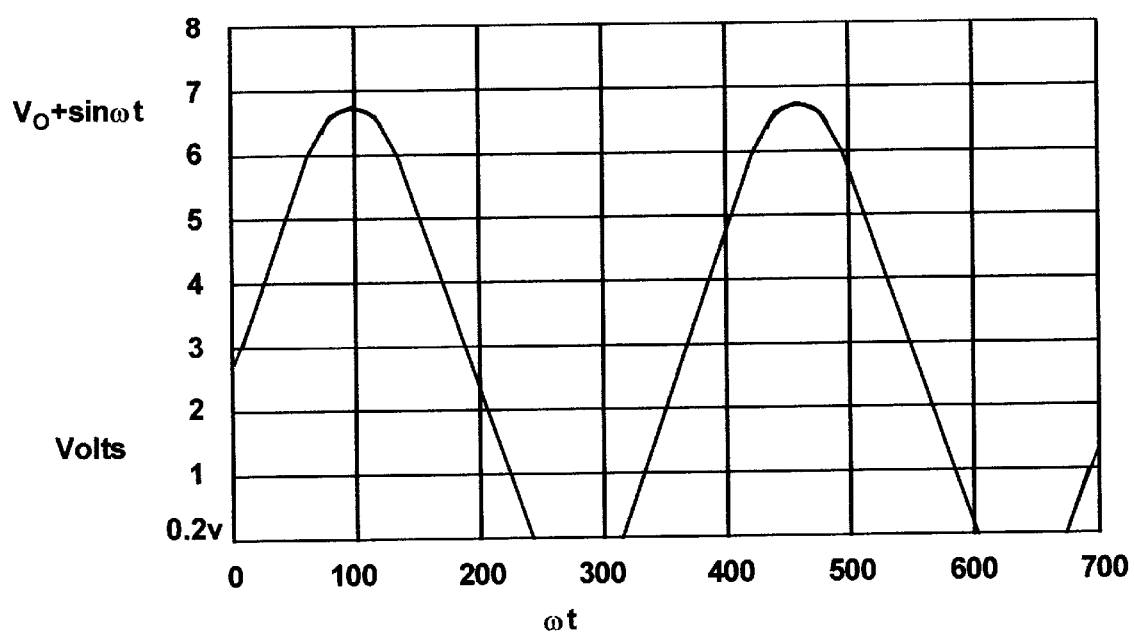
FIG. 2B is a graph of the output voltage swing of a power amplifier in a saturated mode.

As illustrated in FIG. 2A, a graphical representation of a sinusoidal output voltage, $V_{OUT}$, of the transistor of power amplifier 112 shows the margin to saturation when employing an exemplary 4.8V voltage supply. If the voltage supply is reduced, the signal as shown in FIG. 2A is shifted toward the x-axis. Alternatively, if the voltage supply were increased, the output voltage illustrated in FIG. 2A would shift away, vertically, from the x-axis. Input power to the power amplifier can be increased (or the supply voltage to the power amplifier can be decreased) as the lowest peaks of the voltage supply approach zero, as long as the voltage swing of the output voltage, $V_{OUT}$ does not cross the 0.2V level on the y-axis of the graph. As shown in FIG. 2B, if $V_{CC}$ is reduced too much, the minimum voltage swing of the output voltage, $V_{OUT}$, will become less than or equal to approximately 0.2V. The margin to saturation will become zero. As a result, the power amplifier 112 would enter a saturation mode and "clip" (i.e., distort) the output voltage as shown. When the output voltage is distorted, as illustrated in FIG. 2B, the power amplifier circuits 110 operation is hampered.

To further illustrate the considerations associated with optimizing amplifier operation, the efficiency of the power amplifier 112 is defined as follows:

$$\text{Efficiency} = P_{OUT}/V_{CC} * I_{CC}, \quad (1)$$

where $P_{OUT}$ is the output power of the power amplifier 112. As can be deduced from the equation, one or both of the supply voltage $V_{CC}$ or the bias current, $I_{CC}$, must be minimized in order to increase the efficiency of the power amplifier. However, as illustrated above, control of the voltage supply should be performed without "clipping" the signal.

Figure 3:
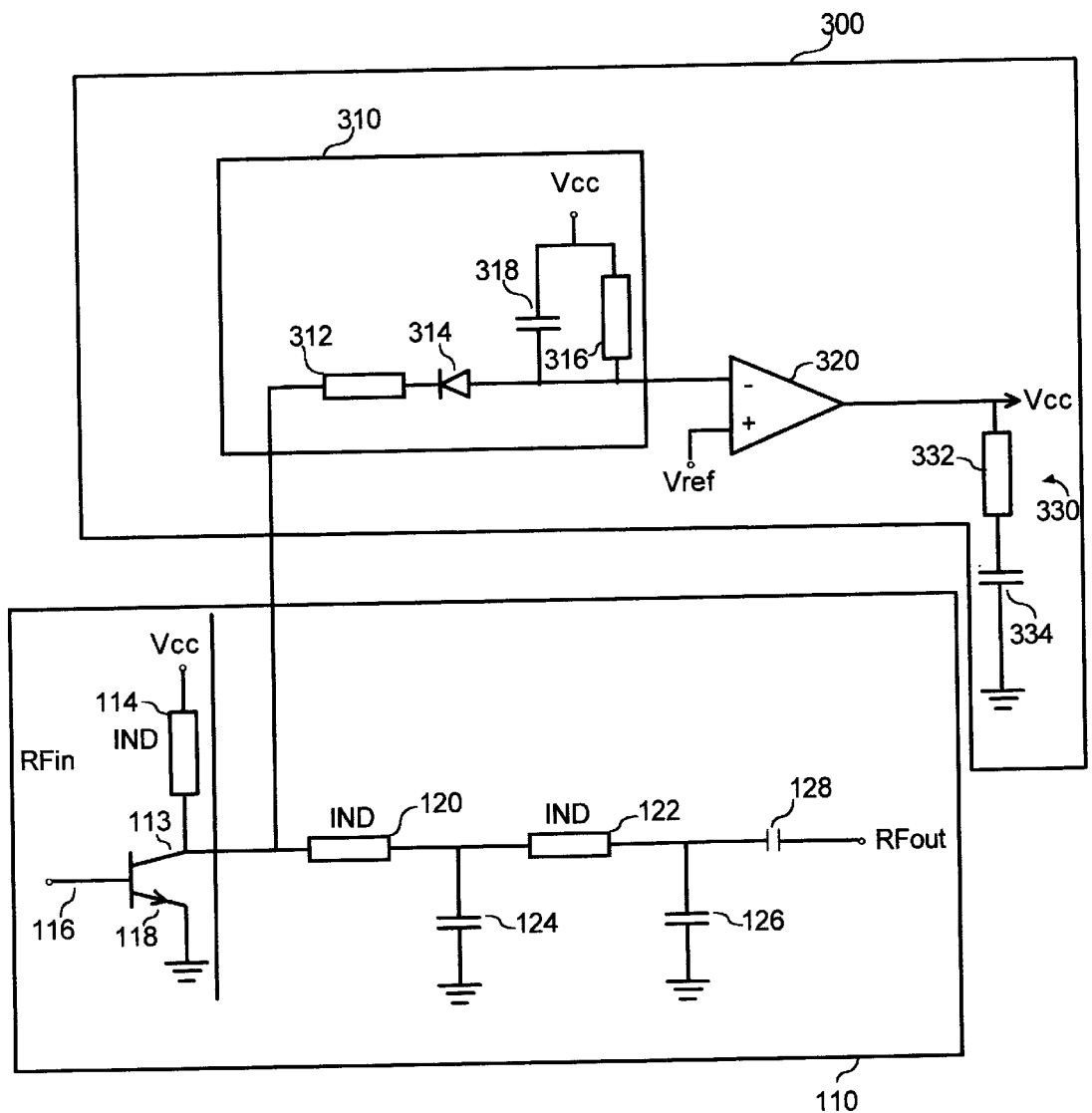
FIG. 3 is a schematic diagram of a power amplifier circuit and a feedback circuit in accordance with an exemplary embodiment of the present invention.

This issue is addressed according to exemplary embodiments of the present invention by, as illustrated in FIG. 3, providing a power amplifier control circuit 300 in addition to the power amplifier circuit 110 described with respect to FIG. 1. The power amplifier control circuit 300 includes a peak detector 310, a differential amplifier 320 and loop filter 330. These elements are employed to ensure that the voltage supply, $V_{CC}$, is decreased while not sending the power amplifier 112 into a saturated state.

The peak detector 310 includes a resistor 312 in series with a diode 314 on an input line from the output of the power amplifier 112. Additionally, a second resistor 316 is placed in parallel with a capacitor 318 each receiving voltage from the voltage supply, $V_{CC}$. The peak detector 310 is designed to follow the minimum envelope, i.e., to identify the negative peaks in the output from the power amplifier 112. This enables the system of the present invention to determine if the voltage supply is getting too close to the "clipping" voltage which would send the power amplifier 112 into saturation.

The peak detected voltage value detected in peak detector 310 is output to an inverting input of the differential amplifier 320. The peak detected voltage value is then compared to a voltage reference value, $V_{REF}$. The differential amplifier 320 controls the voltage supply to ensure optimum power amplifier operation to thereby keep a distance to the point of saturation. The difference signal which is output from the differential amplifier 320 is sent, via a loop filter 330 (a resistance 332 in series with a capacitance 334), to control the $V_{CC}$ value input into power amplifier 112. The loop filter is employed to restrict the signal bandwidth to a specific level in order to prevent the loop from being unstable and to attenuate transient signals and noise signals.

The voltage reference value sets the margin between the amplifier's operating point and saturation. The voltage reference value is chosen so that the distance between the lowest envelope of $V_{OUT}$ and the point of saturation is kept to a value that is greater than zero. This reference voltage can be adjusted and optimized using a temperature coefficient to account for temperature deviations in the power amplifier and/or peak detector.

Figure 4:
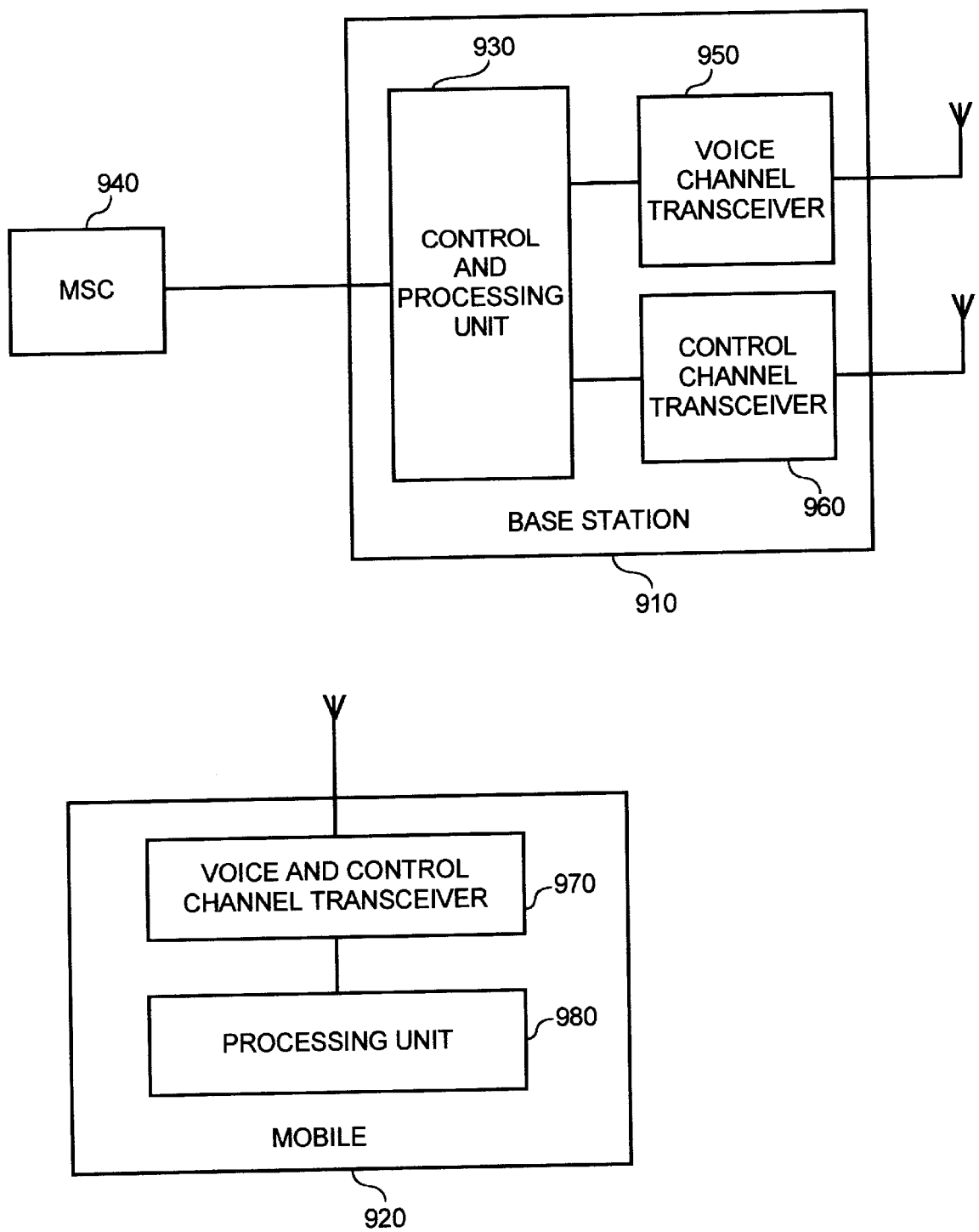
FIG. 4 is a block diagram of a cellular mobile radiotelephone system in accordance with an exemplary embodiment of the present invention.

As mentioned earlier, power amplifier circuits according to the present invention may be used in, for example, cellular telephone units. These devices can be used to amplify and transmit messages at different power levels used to support communications between mobile and base stations in radio communication systems. FIG. 4 represents a block diagram of an exemplary cellular mobile radio telephone system according to one embodiment of the present invention in which power amplifiers described above can be used to generate RF signals for data transmission. The system shows an exemplary base station 910 and a mobile 920. The base station includes a control and processing unit 930 which is connected to the MSC 940 which in turn is connected to the public switched telephone network (not shown).

The base station 910 for a cell includes a plurality of voice channels handled by voice channel transceiver 950 which is controlled by the control and processing unit 930. Also, each base station includes a control channel transceiver 960 which may be capable of handling more than one control channel. The control channel transceiver 960 is controlled by the control and processing unit 930. The control channel transceiver 960 broadcasts control information over the control channel of the base station or cell to mobiles locked to that control channel. The voice channel transceiver handles the traffic or voice channels which can include digital control channel location information as described previously.

When the mobile 920 first enters the idle mode, it periodically scans the control channels of base stations like base station 910 to determine which cell to lock on or camp to. The mobile 920 receives the absolute and relative information broadcasted on a control channel at its voice and control channel transceiver 970. Then, the processing unit 980 evaluates the received control channel information which includes the characteristics of the candidate cells and determines which cell the mobile should lock to. The received control channel information not only includes absolute information concerning the cell with which it is associated, but also contains relative information concerning other cells proximate to the cell with which the control channel is associated. These adjacent cells are periodically scanned while monitoring the primary control channel to determine if there is a more suitable candidate. Additional information relating to specifics of mobile and base station implementations can be found in U.S. patent application Ser. No. 07/967,027 entitled "Multi-Mode Signal Processing" filed on Oct. 27, 1992 to P. Dent and B. Ekelund, which disclosure is incorporated by reference.

Although the foregoing exemplary embodiment has been described in terms of base and mobile stations, the present invention can be applied to any radiocommunication system. For example, satellites could transmit and receive data in communication with remote devices, including portable units, PCS devices, personal digital assistants, etc.

While the present invention has been described with respect to its preferred embodiment, those skilled in the art will recognize that the present invention not limited to the specific embodiment described and illustrated herein. Different embodiments and adaptations besides those shown herein and described as well as many variations, modifications and equivalent arrangements will now be apparent or will be reasonably suggested by the foregoing specification and drawings without departing from the substance of the scope of the invention.

What is claimed is:

1. A amplifier and control circuit, comprising:
   a power amplifier powered by a voltage supply;
   a peak detector which detects a peak amplitude of an output voltage of said power amplifier; and
   a differential amplifier which compares the peak amplitude of the output of said power amplifier to a reference voltage and outputs a corrected voltage supply signal;
   wherein said peak amplitude is a negative peak amplitude of said output voltage.

2. The amplifier and control circuit of claim 1, further comprising:
   a loop filter connected to the output of said differential amplifier.

3. The amplifier and control circuit of claim 1, wherein said reference voltage is chosen to ensure that said power amplifier does not enter a saturated state.

4. The amplifier and control circuit of claim 1, wherein said power amplifier further comprises:
   multiple stages of individual transistor elements.

5. The amplifier and control circuit of claim 1, further comprising:
   an impedance matching network connected to the output of said power amplifier.

6. The amplifier and control circuit of claim 1, wherein said reference voltage is chosen to account for temperature deviations in at least one of said power amplifier and said peak detector.

7. A method of controlling a power amplifier circuit, comprising the steps of:

detecting a peak amplitude of an output voltage from a power amplifier in said power amplifier circuit;

comparing the detected amplitude of the output voltage to a reference voltage and outputting a corrected voltage signal; and controlling a voltage supply of said power amplifier circuit based upon the corrected voltage signal;

wherein said peak amplitude is a negative peak amplitude of said output voltage.

8. The method of controlling the power amplifier circuit of claim 7, wherein said comparing step further comprises:

choosing said voltage reference to ensure that the power amplifier does not enter a saturated mode.

9. The method of controlling the power amplifier circuit of claim 7, further comprising the step of:

impedance matching said corrected voltage signal.

10. The method of controlling the power amplifier circuit of claim 8, wherein said reference voltage is chosen to account for temperature deviations.

11. A transmitter for transmitting an outgoing signal, said transmitter further comprising:

a power amplifier to amplify said outgoing signals before transmission;

a peak detector which detects a peak amplitude of an output of said power amplifier; and a differential amplifier which compares the amplitude of the output of said power amplifier to a reference voltage and outputs a corrected signal to be input to said power amplifier;

wherein said reference voltage is chosen to ensure that said power amplifier does not enter a saturated state.

12. The transmitter of claim 11, further comprising:

a loop filter connected to the output of said differential amplifier.

13. The transmitter of claim 11, wherein said power amplifier further comprises:

multiple stages of individual transistor elements.

14. The transmitter of claim 11, further comprising:

a matching circuit connected to the output of said power amplifier.

15. The transmitter of claim 11, wherein said constant reference voltage is chosen to account for temperature deviations in one of said power amplifier and said peak detector.

* * * * *